United States Patent [19]

Palloch et al.

[11] 4,361,350

[45] Nov. 30, 1982

[54] SECURING DEVICE FOR A HOUSING COVER ELEMENT, ESPECIALLY FOR SWITCH BOXES HAVING ELECTRICAL SWITCHING DEVICES

[75] Inventors: Herbert Palloch, Schwetzingen; Hans Erndt, Wiesloch, both of Fed. Rep. of Germany

[73] Assignee: Fabrik für Elektromotorenu. elektrische Apparate, Schwetzingen, Fed. Rep. of Germany

[21] Appl. No.: 137,893

[22] Filed: Apr. 7, 1980

[30] Foreign Application Priority Data

Apr. 6, 1979 [DE] Fed. Rep. of Germany ....... 2913938

[51] Int. Cl.³ .............................................. E05C 5/04
[52] U.S. Cl. ..................................... 292/251; 292/58; 70/166
[58] Field of Search ................. 292/251, 176, 350, 58; 70/166, 167, 63

[56] References Cited

U.S. PATENT DOCUMENTS

| | | | |
|---|---|---|---|
| 1,125,371 | 1/1915 | Nash ................................. | 292/251 X |
| 2,294,261 | 8/1942 | Wilkinson ....................... | 292/251 X |
| 2,722,822 | 11/1955 | Thomas ............................. | 70/167 |
| 2,815,237 | 12/1957 | Winterburn et al. ........... | 292/251 X |
| 3,018,127 | 1/1962 | Dobrosielski ..................... | 292/251 |
| 3,213,653 | 10/1965 | Probasco ........................... | 70/166 |
| 3,250,559 | 5/1966 | Somerfeld .......................... | 292/251 |
| 3,534,570 | 10/1970 | Mauro ................................ | 70/167 |

FOREIGN PATENT DOCUMENTS 962725 10/1956 Fed. Rep. of Germany ........ 292/58
7824594 11/1978 Fed. Rep. of Germany ........ 292/58

Primary Examiner—William E. Lyddane
Assistant Examiner—Peter A. Aschenbrenner
Attorney, Agent, or Firm—Browdy and Neimark

[57] ABSTRACT

An arrangement for securing a housing cover, especially useful for securing a cover for a switch box having electrical switching devices therein includes at least one screwable element which can be threaded to the housing and which is secured undetachably on the cover by a stop on its shaft. The shaft extends through the cover, each of the screwable elements extending through a bottom of an indentation in a surface of the cover. A pre-stressed compression spring is disposed in the indentation between a shoulder of the screwable element and the base of the indentation. Each screwable element comprises a shaft nut, the shaft nut having a shaft with an indentation in its pressure-receiving face. The shaft engages with a threaded pin attached to the housing and rests against a structural part which is supported against a support attached to the housing. The screwable element is centered by a centering body positioned directly ahead of the support on the threaded pin.

10 Claims, 1 Drawing Figure

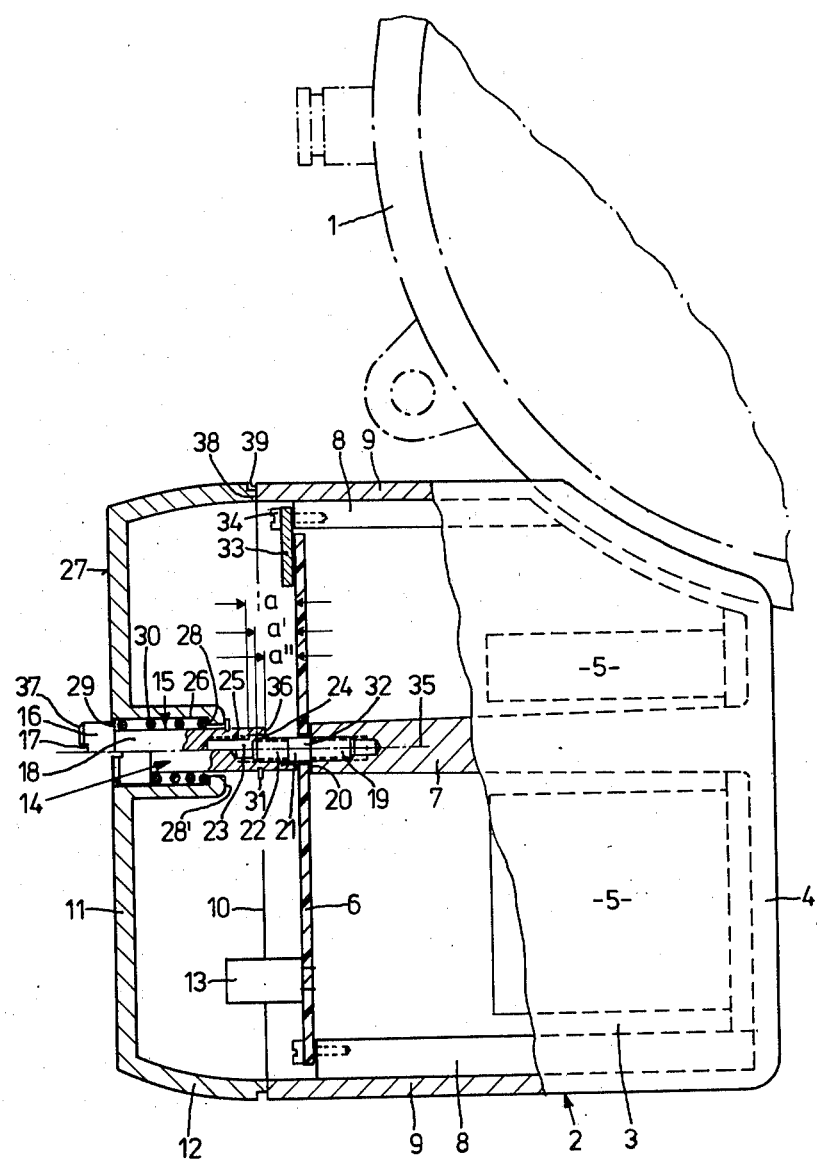

1

SECURING DEVICE FOR A HOUSING COVER ELEMENT, ESPECIALLY FOR SWITCH BOXES HAVING ELECTRICAL SWITCHING DEVICES

BACKGROUND OF THE INVENTION

This invention relates to a securing device for a housing cover element. The invention relates more particularly to a securing device for switch boxes having electrical switching devices, having at least one screwable element which can be threaded to the housing and which is secured undetachably to the cover element by a stop on its shaft penetrating the cover element, wherein each screwable element extends through an indentation in the surface of the cover element in which a pre-stressed compression spring is disposed between a shoulder of the screw element and the base of the indentation.

A securing device of the type described above is known from West-German published design application No. 78 24 594, in which a sheath provided with an indentation is secured on a cover element, namely the cap, of an electrical appliance. A securing bolt penetrates the indentation, a pre-stressed compression spring is disposed between the head of the bolt and the base of the indentation. The securing bolt penetrates a corresponding opening in the base of the sheath. On a free end, the securing bolt has a cylindrical cross-piece which, in order to fix the cover element on the electrical appliance, is disposed behind corresponding stop faces on the appliance by a partial circular rotation of the securing bolt. With this securing device, only the cover element can be secured releasably on the housing of the appliance.

From West-German published patent application No. 962,725, a snap closure for the housing of electrical appliances is known in which a securing bolt penetrates a bore in the housing cap. The securing bolt is provided on its outer end with an actuation grip. On its inner end, it is provided with a protrusion which can be guided into guide paths of a cover body attached to the housing by means of a partial circular rotation and fixed there. Between the interior of the cap and a disc resting loosely against the protrusion, there is a pre-stressed compression spring which, upon fixing on the cover element, is further pre-stressed by the rotating insertion of the protrusion in the guide paths, because the disc, acting as a stop, remains in contact with the cover body. The cover element is not pressed by this spring against the housing, but rather against the rotary grip of the securing bolt. This securing device effectively serves only to fix one cover element on a housing.

SUMMARY OF THE INVENTION

It is accordingly the principle object of the present invention to improve a securing device of the type described above, by virtue of which a tilt-free fixing of the cover element on the housing in the junction plane is assured, in such a manner that at the same time a precise fixing of one structural member in the housing is assured in the course of covering the housing with the cover element.

The foregoing object, as well as others which are to become clear from the text below, is achieved in accordance with the invention as an improvement of a securing device for a housing cover element, especially for switch boxes having electrical switching devices. The securing device is provided with at least one screwable element which can be threaded to the housing and which is secured undetachably on the cover element by a stop on its shaft penetrating the cover element. Each screwable element extends through an indentation in the cover element surface in which a pre-stressed compression spring is disposed between a shoulder of the screw element and the indentation base.

The device is improved in that the shaft of the screwable element, embodied in the shape of a shaft nut, penetrating the base is equipped outside the indentation, with a pressure face. The pressure face, when the cover element is supported relative to the housing and in the state in which it is bolted counter to the force of the compression spring with a threaded pin attached to the housing, rests against a structural part which is supported against a support attached to the housing and which is centered by a centering body positioned directly ahead of the support on the threaded shank.

In the illustrative embodiment when the screwable element is tightened, the securing device causes the tightening of the structural member which is to be fixed on or in the housing, especially a printed circuit board, against a support attached to the housing. At the same time, an elastic, but fixed and tilt-free contact of the circumference of the end rim of the cover element against the housing which is to be covered is effected via the screw element and a compression spring of high rigidity, which is disposed between the head of the screw element and the cover element and which spring, in the tensed state as well, has the characteristic of a remnant spring path. In addition to the orientation of its position in the housing, which takes place perpendicularly to the main plane of the circuit board or the like, a centering also occurs in the sense of at least one fixation to the housing in the direction of the two coordinates in the main plane of the circuit board.

BRIEF DESCRIPTION OF THE DRAWING

The invention is to be better understood, and further objects and advantages thereof are to become apparent, from the ensuing detailed description of a preferred embodiment taken in conjunction with the drawing.

The single FIGURE is a somewhat diagramatic, partially cutaway cross-sectional view of a control box secured on a motor housing parallel to its longitudinal axis, an illustrative embodiment of the improved securing device in accordance with the invention being illustrated above its longitudinal axis in the unbolted state and below its longitudinal axis in the bolted state.

DESCRIPTION OF THE PREFERRED EMBODIMENT

As shown in the drawing, a housing 2 of a control box 3 is secured at the side below a motor housing 1, shown in phantom as end view. The control box 3 serves to receive electromechanical or electronic switches and electrical open-loop and closed-loop circuits, as well as the associated power supply for the control of the motor. On a base 4 of the control box 3, shown in end view and cross section, large structural components and circuits units 5, such as transformers, rectifier sets and capacitors, are secured. The electronic circuits themselves are embodied, for example, as wired-in printed circuits on a printed circuit board 6. The circuit board 6 rests on the end faces of a strut 7 and as illustrated, strut ribs 8, which extend from the base 4 and out of respective side walls 9 of the housing 1. As shown, the strut 7, strut ribs 8, side walls 9 and the base 4 are integral, these members being formed integrally therewith during casting. The printed circuit board 6 may be supported differently. For example, the board 6 may be supported solely by the strut 7 or the ribs 8 or the walls 9 or any combination thereof.

For the sake of easy accessibility of the components and/or circuit testing points disposed on the circuit board 6, and for the sake of providing sufficient space in the housing 2 for receiving the large circuit units 5, the circuit board 6 extends parallel to a junction plane 10 between the housing 2 and a hood-like cover element 11, acting as a cap, which in the direction of the junction plane 10 has rims 12 drawn forward in the fashion of a hood for the purpose of engaging structural parts 13 disposed on the circuit board 6 and protruding beyond the junction plane 10.

A securing device 14 serves equally to center and to fix a structural part, in this illustrative case the printed circuit board 6, on the housing 2 and also to cover the opening of the housing 2 by the hood-like cover element 11 in such a fashion as to make it easily and readily accessible. The securing device 14, in the illustrated and preferred exemplary embodiment, includes a screwable element 15 in the form of a shaft nut having a cylindrical head 16 with a slot 17 for a screwdriver on one end of the shaft 18 and an associated threaded pin 19, which is threadedly inserted to approximately half its length into the end of the strut 7 which serves as a support 20 for the circuit board 6. A limited axial area, directly adjacent the support 20, of the portion of the threaded pin 19 protruding out of the strut 7 acts as a centering body 21 for adjusting the circuit board 6 radially relative to the longitudinal axis of the securing device 14 and is formed without a thread thereon; for instance, it had a smooth cylindrical shape as illustrated or a frusto-conical shape which tapers slightly in the direction of the cover element 11. A threaded protrusion 22 is shown integral with the centering body 21, but may otherwise be fixed thereto. This threaded protrusion 22 is operatively associated with a coaxial blind bore 23 in the shaft nut screwable element 15 on the end of the shaft 18 remote from the head 16. In its distal area, the blind bore 23 is embodied as a hollow, cylindrical opening 24 having a larger cross-section than the cross-section of the centering body 21 and it is provided towards the inside of the shaft 18 with a thread 25 corresponding to the thread of the threaded protrusion 22.

The screwable element 15 with its head 16 is disposed in a cylindrical indentation 26 in outer face 27 of the cover element 11, in which a compression spring, preferably in the form of a helical spring 30, is disposed, surrounding the shaft 18, between a base 28 of the indentation 26 and a shoulder 29 which is formed by the head 16 relative to the adjacent shaft 18. The helical spring 30 is pre-stressed, so that it tends to push the screwable element 15 of the securing device 14 out of the outer surface 27 of the cover element 11, so long as it is not in engagement with the threaded pin 19. This axial displacement movement is limited by a securing ring acting as a stop 31, which is disposed on a side 28' of the indentation base 28 oriented towards the interior of the housing 2 in the outer jacket of the shaft 18.

It is sufficient per se, in order to assure unequivocal adjustment of the circuit board 6 in the housing 2, to provide a centering body 21, which if needed, has an unequilateral cross-section, and to provide a correspondingly shaped aperture 32 in the circuit board 6. However, it is more efficient to provide at least two centering bodies of this kind by way of the support 20 attached to the housing with a simple geometric shape as the threaded pin 19, for instance a cylindrical or frusto-conical embodiment of the centering body 21, and to dispose one correspondingly dimensioned aperture in the circuit board 6 as the aperture 32 for each centering body. During mounting of the circuit board 6 in the housing 2, its contact on the end faces of the strut ribs 8 and the strut 7, when at least two threaded pins 19 are present which have areas acting as a centering body in both coordinate directions on the main plane of the circuit board, results in an unequivocal positioning of the circuit board relative to the housing 2.

After being manually pressed against the corresponding support 20, the side rims of the printed circuit board 6 can, in order to increase the mechanical stability, be connected directly or, by way of example, via cooling strips 33 bearing structural elements of the electronics, with the strut ribs 8 molded onto the side walls 9, for example, by screws 34. Because an unequivocal fixing of position is already predetermined in the direction of the main plane of the circuit board 6, faulty bracing of the circuit board can no longer occur, which would otherwise create the danger of hairline breaks in the printed circuit.

Simultaneously with the emplacement and securing of the hood-like cover element 11 on the junction plane 10 of the housing 2, a precise fixing also takes place of the circuit board 6 relative to each support 20, that is, in the direction of the longitudinal axis 35 of the securing device 14. In order to assure an unequivocal fixing of the circuit board 6 on each support 20 in the direction of the longitudinal axis 35 of the securing device 14, the securing device 14 is designed such that, whenever the circuit board 6 is fixedly supported between the support 2 on the one hand and the associated pressure face 36 of the shaft 18 on the other, and when at the same time the cover element 11 is in its position in place on the housing, the helical spring 30 is not yet completely compressed; thus the shoulder 29 is still elastic and does not press nearly rigidly via the helical spring 30 against the base 28 of the indentation 26 in the cover element 11. In this position, an end face 37 disposed on the outside of the cylindrical head 16 of the screwable element 15 is in approximate alignment with the surface 27 of the cover element 11.

As shown in the upper half of the screwable element 15 in the drawing, the distance between the side 28' of the indentation base 28 oriented towards the interior of the housing 2 from the surface 27 of the cover element 11 is somewhat greater than the distance of the securing ring 31 acting as a stop from a shoulder 29 on the screwable element 15. As a result, the head 16 of the screwable element 15 is necessarily still guided, at least to a limited extent, within the cylindrical indentation 26 even in the unbolted state, i.e., the loosened state, which makes accessibility simpler and easier.

Because, in addition, the inner diameter of the cylindrical indentation 26 is only slightly greater than the outer diameter of the cylindrical head 16 of the screwable element 15, the head 16 is radially guided in the indentation 26, which in turn means that the securing device 14 can also be used for centering the cover element 11 relative to the housing 2. Thus, no centering rim is necessary on the end faces 38 of the rim 12 of the cover element 11, on the one hand, and on the end face 39 of the housing 2 in the junction plane 10, on the other hand.

Furthermore, in the unbolted state of the securing device 14, i.e. in the position of the securing device 14 shown in the top half of the drawing, a distance a between the beginning of the thread 25 and the associated top side of the circuit board 6 is somewhat greater than the distance a' to the thread on the threaded protrusion 22. As a result, it is possible to place the cover element 11 firmly in its final position on the housing 2 before beginning the tightening of the securing device 14. On the other hand, in this position, the distance a" of a pressure face 36 from the associated top side of the circuit board 6 is somewhat smaller than the distance a' mentioned above, so that in this position the hollow cylindrical opening 24 in the shaft 18 already engages the threaded protrusion 22 in such a manner as to provide preliminary centering thereof.

It is to be understood that the foregoing description of preferred embodiment is given entirely by way of illustrative example and not by way of limitation. It is to be understood that numerous other embodiments and variants of the invention are possible without departing from the scope of the invention, the scope being defined by the appended claims.

What is claimed is:

1. An improved arrangement for securing a cover to a housing, especially a cover for a box housing electrical devices, at least one screwable element, said cover being formed with an indentation for each said screwable element, each said indentation comprising a bottom wall formed with an opening to receive a said screwable element, compression spring means disposed in said indentation between a shoulder formed on said screwable element and said indentation bottom wall for normally urging said screwable element outwardly of said indentation and away from said housing, and said screwable element comprising stop means to limit the motion of said screwable element out of said indentation and to hold said screwable element captive in said indentation, the improvement comprising a threaded pin having a first portion secured to said housing and a second portion adapted to cooperate with said cover, said screwable element comprising a pressure face formed at its free end at the inside of said cover, a structural part secured to said housing, said pressure face of said screwable element being adapted to bear against said structural part in the secured together condition of said cover on said housing, said threaded pin comprising a third portion comprising a centering body which mates with a suitably formed opening in said structural part in the correctly assembled together conditions of said structural part in said housing and of said cover on said housing, and said screwable element comprising a shaft nut for engaging said threaded pin second portion against the force of said compression spring means for removably securing said cover on said housing.

2. An improved arrangement as defined by claim 1, wherein said second portion comprises a freely protruding threaded protrusion on said threaded pin, and said screwable element has a hollow cylindrical opening engaging said centering body axially and radially with play in the region of said pressure face, and said shaft nut comprising an adjacent bore oriented towards said threaded protrusion and formed with a thread.

3. An improved arrangement as defined in either claim 1 or claim 2, wherein said screwable element is provided on its outer end opposite said pressure face with a cylindrical head, said indentation being of cylindrical shape, and said screwable element cylindrical head being only somewhat smaller than the diameter of said indentation.

4. An improved arrangement as defined in either claim 1 or claim 2, wherein the distance between said stop means on said shaft and said shoulder is shorter than the distance between an outer surface of said cover and that surface of said indentation bottom wall oriented towards the interior or said housing.

5. An improved arrangement according to claim 2, wherein when said cover is placed on said housing with the arrangement unbolted, the distance between the start of said shaft nut thread and the surface of said structural part against which said screwable element pressure face bears is longer than the distance between the start of said thread of said threaded protrusion and said structural part surface.

6. An improved arrangement according to claim 2, wherein when said cover is placed on said housing with the arrangement unbolted, the distance between said pressure face and that surface of said structural part against which said screwable element pressure face bears is shorter than the distance between the start of said thread of said threaded protrusion and said structural part surface.

7. An improved arrangement according to claim 2, wherein when said cover is placed on said housing with the arrangement unbolted, the distance between said pressure face and that surface of said structural part against which said pressure face bears is smaller than the distance between the start of said thread of said threaded protrusion and said structural part surface.

8. An improved arrangement as defined in either claim 1 or claim 2, wherein said compression spring means comprising a compression spring, and wherein when said cover is placed on said housing with the arrangement bolted, the distance between said shoulder of said screwable element and the facing surface of said bottom of said indentation is somewhat longer than the fully compressed length of said compression spring.

9. An improved arrangement according to claim 1, wherein the distance between said stop means and said shoulder is shorter than the distance between an outside surface of said cover and that surface of said bottom wall with which said stop cooperates, whereby said screwable element is held captive and aligned in said cover indentation.

10. An improved arrangement according to claim 1, wherein said structural part comprises a printed circuit board.

* * * * *

UNITED STATES PATENT AND TRADEMARK OFFICE
CERTIFICATE OF CORRECTION

PATENT NO. : 4,361,350

DATED : November 30, 1982

INVENTOR(S) : Herbert PALLOCH and Hans ERNDT

It is certified that error appears in the above-identified patent and that said Letters Patent is hereby corrected as shown below:

On the title page /73/ Assignee: should read

--- Frankl & Kirchner GmbH & Co KG
Fabrik für Elektromotoren u.
elektrische Apparate. ---

Signed and Sealed this

Twenty-second Day of March 1983

[SEAL]

Attest:

GERALD J. MOSSINGHOFF

Attesting Officer  Commissioner of Patents and Trademarks